US012660372B2

(12) United States Patent
Chang et al.

(10) Patent No.: US 12,660,372 B2
(45) Date of Patent: *Jun. 16, 2026

(54) LIGHT EMITTING DIODES WITH ALUMINUM-CONTAINING LAYERS INTEGRATED THEREIN AND ASSOCIATED METHODS

(71) Applicant: GOOGLE LLC, Mountain View, CA (US)

(72) Inventors: Ying-Lan Chang, Cupertino, CA (US); Benjamin Leung, Sunnyvale, CA (US); Miao-Chan Tsai, Sunnyvale, CA (US); Richard Peter Schneider, Jr., Mountain View, CA (US); Sheila Hurtt, Palo Alto, CA (US); Gang He, Cupertino, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/742,543

(22) Filed: Jun. 13, 2024

(65) Prior Publication Data

US 2024/0413266 A1     Dec. 12, 2024

Related U.S. Application Data

(63) Continuation of application No. 17/307,561, filed on May 4, 2021.

(Continued)

(51) Int. Cl.
*H10H 20/812*     (2025.01)
*H10H 20/01*     (2025.01)

(Continued)

(52) U.S. Cl.
CPC .......... *H10H 20/812* (2025.01); *H10H 20/01* (2025.01); *H10H 20/8162* (2025.01);
(Continued)

(58) Field of Classification Search
CPC .... H10H 20/812; H10H 29/142; H10H 20/01; H10H 20/841; H10H 20/8162; H10H 20/825
See application file for complete search history.

(56) References Cited

U.S. PATENT DOCUMENTS 8,598,565 B2     12/2013   Brandes
9,252,329 B2      2/2016   Northrup et al.
(Continued)

FOREIGN PATENT DOCUMENTS

CN     101281945 A     10/2008
CN     104051586 A      9/2014
(Continued)

OTHER PUBLICATIONS

Extended European Search Report for European Application No. 21799577.8, mailed May 10, 2024, 11 pages.
(Continued)

*Primary Examiner* — Mohammad M Choudhry
(74) *Attorney, Agent, or Firm* — Brake Hughes Bellermann LLP

(57)     ABSTRACT

A light-emitting diode (LED) structure includes an active region that has at least one aluminum-containing quantum well (QW) stack that emits light from the LED structure when activated. The LED structure exhibits a modified internal quantum efficiency value, which is higher than a LED structure that does not include aluminum within a QW stack. The LED structure also exhibits a modified peak wavelength, which is longer than an unmodified peak wavelength of the unmodified LED structure.

21 Claims, 15 Drawing Sheets

<div style="display:flex">

<div>

Related U.S. Application Data

(60) Provisional application No. 63/135,288, filed on Jan. 8, 2021, provisional application No. 63/019,765, filed on May 4, 2020.

(51) Int. Cl.

| | |
|---|---|
| *H10H 20/816* | (2025.01) |
| *H10H 20/825* | (2025.01) |
| *H10H 20/841* | (2025.01) |
| *H10H 29/14* | (2025.01) |

(52) U.S. Cl.
CPC ........ *H10H 20/825* (2025.01); *H10H 20/841* (2025.01); *H10H 29/142* (2025.01)

(56) References Cited

U.S. PATENT DOCUMENTS

| | | | |
|---|---|---|---|
| 10,141,477 | B1 | 11/2018 | Bhusal et al. |
| 10,396,240 | B2 | 8/2019 | Yeh et al. |
| 10,586,829 | B2 | 3/2020 | Yoo |
| 2002/0123164 | A1 | 9/2002 | Slater et al. |
| 2003/0209717 | A1 | 11/2003 | Okazaki |
| 2005/0170537 | A1 | 8/2005 | Hooper et al. |
| 2009/0090900 | A1 | 4/2009 | Avramescu et al. |
| 2010/0187497 | A1 | 7/2010 | Nago et al. |
| 2013/0069035 | A1 | 3/2013 | Kikuchi et al. |

</div>

<div>

| | | | | |
|---|---|---|---|---|
| 2013/0082237 | A1 | | 4/2013 | Northrup et al. |
| 2016/0372631 | A1 | | 12/2016 | Hasegawa et al. |
| 2017/0018679 | A1 | | 1/2017 | Lee |
| 2017/0104128 | A1 | | 4/2017 | Yeh et al. |
| 2018/0261717 | A1 | | 9/2018 | Rudolph |
| 2019/0058080 | A1 | * | 2/2019 | Ahmed ............... H01L 21/6835 |
| 2019/0109262 | A1 | | 4/2019 | Danesh et al. |
| 2019/0229149 | A1 | | 7/2019 | Yoo |
| 2019/0229239 | A1 | * | 7/2019 | Bergbauer ......... H10H 20/8252 |
| 2020/0035880 | A1 | * | 1/2020 | Brodoceanu ......... H10H 20/854 |
| 2020/0075798 | A1 | | 3/2020 | Sokol et al. |

FOREIGN PATENT DOCUMENTS

| | | | | |
|---|---|---|---|---|
| CN | 107919414 | A | | 4/2018 |
| CN | 108292693 | A | | 7/2018 |
| CN | 110010731 | A | | 7/2019 |
| CN | 114843378 | A | * 8/2022 | ........ H01L 33/0062 |
| JP | H11330552 | A | | 11/1999 |
| JP | 2011512671 | A | | 4/2011 |
| JP | 2018531514 | A | | 10/2018 |
| TW | 201622183 | A | | 6/2016 |
| WO | 2011090581 | A1 | | 7/2011 |

OTHER PUBLICATIONS

International Search Report and Written Opinion from PCT Apn No. PCT/US2021/030699, Aug. 12, 2021, 15 pages.

\* cited by examiner

</div>

</div>

100

P-layers    140

Active MQW region
130

Bulk or prep layer(s)    120

Semiconductor template
110

| P-layer(s) | 350 |

| Active QWs | 340 |

| AlGaN Layer | 420 |

| Inactive QWs |
| 410 |

| Semiconductor template |
| 310 |

500

P-layer(s)   <u>350</u>

Active QWs <u>340</u>

Reflective Layer <u>510</u>

First Preparation Layer
<u>320</u>

Semiconductor template
<u>310</u>

600

| P-layer(s)  350 |
| Active QWs 340 |
| Hole Blocking Layer 610 |
| First Preparation Layer 320 |
| Semiconductor template 310 |

700

800A

P-layer(s)   740

Barrier layer   734

QW   832

Bottom layer w/ Al   836

Barrier layer   734

QW   832

Bottom layer w/ Al   836

Barrier layer   734

QW   832

Bottom layer w/ Al   836

Barrier layer   734

QW   832

Bottom layer w/ Al   836

Barrier layer   734

Active MQW region 830A

Bulk or prep layer(s)   720

Semiconductor template   710

900

P-layer(s)   740

Active MQW region 930

Barrier layer   734
Cap layer w/ Al ———— 932
QW   832

Barrier layer   734
Cap layer w/ Al ———— 932
QW   832

Barrier layer   734
Cap layer w/ Al ———— 932
QW   832

Barrier layer   734
Cap layer w/ Al ———— 932
QW   832

Barrier layer   734

Bulk or prep layer(s)   720

Semiconductor template   710

1000

1100

P-layer(s)    740

Active
MQW
region
1130

Barrier layer    734

QW w/ Al    1032

Bottom layer w/ Al    836

Barrier layer    734

QW w/ Al    1032

Bottom layer w/ Al    836

Barrier layer    734

QW w/ Al    1032

Bottom layer w/ Al    836

Barrier layer    734

QW w/ Al    1032

Bottom layer w/ Al    836

Barrier layer    734

Bulk or prep layer(s)    720

Semiconductor template    710

1200

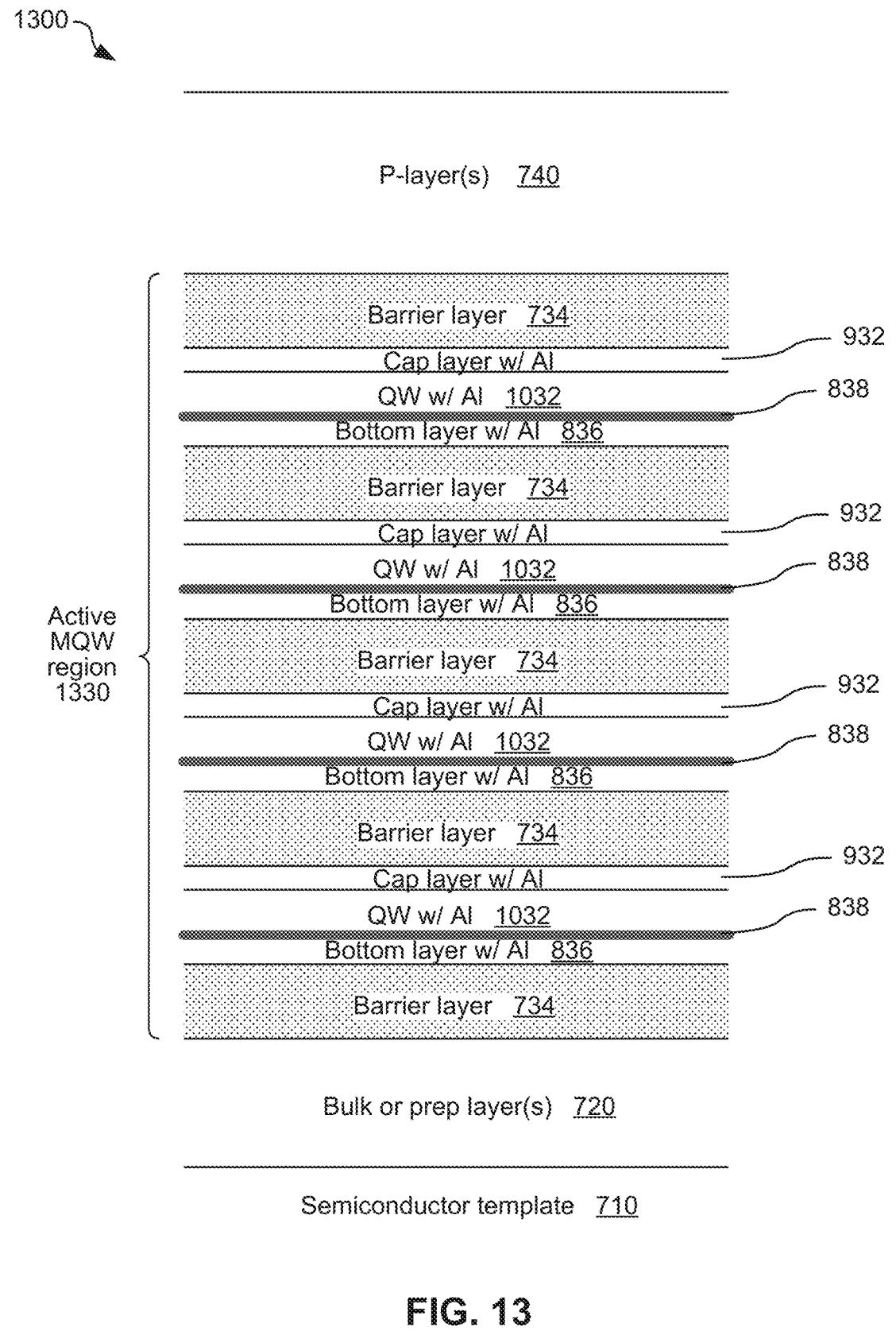

1300 ⌐

P-layer(s)   740

Active
MQW
region
1330

Barrier layer   734
Cap layer w/ Al                                    ⌐ 932
QW w/ Al   1032                                    ⌐ 838
Bottom layer w/ Al   836

Barrier layer   734
Cap layer w/ Al                                    ⌐ 932
QW w/ Al   1032                                    ⌐ 838
Bottom layer w/ Al   836

Barrier layer   734
Cap layer w/ Al                                    ⌐ 932
QW w/ Al   1032                                    ⌐ 838
Bottom layer w/ Al   836

Barrier layer   734
Cap layer w/ Al                                    ⌐ 932
QW w/ Al   1032                                    ⌐ 838
Bottom layer w/ Al   836

Barrier layer   734

Bulk or prep layer(s)   720

Semiconductor template   710

FIG. 13

LIGHT EMITTING DIODES WITH ALUMINUM-CONTAINING LAYERS INTEGRATED THEREIN AND ASSOCIATED METHODS

CROSS REFERENCE TO RELATED APPLICATIONS

This application is a continuation of U.S. application Ser. No. 17/307,561, filed May 4, 2021, which claims the benefit and priority to U.S. Provisional Application No. 63/135,288, filed Jan. 8, 2021 and U.S. Provisional Application No. 63/019,765, filed May 4, 2020. The disclosures of the above listed applications are incorporated herein by reference in their entireties.

BACKGROUND

Aspects of the present disclosure generally relate to light emitting elements, such as those used in various types of displays, and more specifically, to improved active element incorporation in the active layers in light emitting elements.

While there is a need for ever increasing numbers of light emitters (e.g., pixels) in displays to provide better user experience and to enable new applications, increasing the number of light emitters in a display format has become a challenge. To achieve ever smaller light emitters to increase both count and density of light emitters, the potential use of small light emitting diodes (LEDs) such as microLED structures or nano emitters is attractive. However, the currently available techniques for making microLED structures in large numbers, high densities, and capable of producing different colors (e.g., red, green, blue) are cumbersome, time consuming, costly, or result in LED structures with performance limitations.

Advanced LED structures, such as high efficiency LEDs based on Indium-Gallium-Nitride (InGaN) quantum well (QW) structures, require precise formation of a variety of layers of materials designed to cooperate to produce light emission with desired emission characteristics.

FIG. 1 shows a commonly implemented prior-art epitaxial layer LED structure 100. LED structure 100 includes a semiconductor template 110, also known as a semiconductor substrate, for supporting one or more bulk or prep layers 120. An active multiple quantum well (MQW) region 130 is formed on bulk or prep layers 120. Bulk or prep layers 120 is, for example, a thick layer of a material or a structure of two or more materials configured for providing reduced effect of a lattice mismatch and/or thermal expansion coefficient mismatch and/or filtering of defects from semiconductor template 110 to active MQW region 130. The material composition of bulk or prep layers 120 is adjusted to obtain more flexibility in the material selection for active MQW region 130, thus enabling the formation of an active region with desired light emission characteristics. Finally, one or more p-layers 140 are deposited on active QWs to form a p-n diode that provides electronic connectivity to LED structure 100. P-layers 140 include p-doped layers and/or a contact layer. LED structure 100 is then etched or otherwise shaped to form the desired microLED form factor for a designated application.

SUMMARY

While the prior-art LED structure 100 provides a framework for designing a microLED, a range of material selections, specific epitaxial deposition conditions, and combinations of the two are possible. For example, the inclusion of certain material layers within the microLED structure is known to provide favorable optical and electrical characteristics, such as reduced defects giving higher radiative efficiency, and reduced emission wavelength shift. However, to date, a microLED with high efficiency and luminance in the red wavelengths, particularly Indium-Gallium-Nitride (In-GaN)- or Indium-Gallium-Phosphide (InGaP)-based microLED, has been difficult to produce.

The following presents a simplified summary of one or more aspects to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

Aspects of the present disclosure provide techniques and structures that improve the performance of the light emitting elements.

In certain embodiments, a light-emitting diode (LED) structure includes a bulk or prep layer formed on a semiconductor template; an active region formed on the bulk or prep layer and including: a first barrier layer formed on the bulk or prep layer; at least one aluminum-containing active quantum well (QW) stack formed on the first barrier layer; and a second barrier layer formed on the active QW stack; and at least one p-layer formed on the active region; wherein the active region emits light from the LED structure when the at least one active QW stack is driven by an injection current.

In other embodiments, a light-emitting diode (LED) structure includes a semiconductor template; a first preparation layer formed on the semiconductor template; a second preparation layer formed on the first preparation layer; at least one active quantum well (QW) layer formed over the second preparation layer; and at least one p-layer formed on the active QW layer; wherein the active QW layer emits light from the LED structure when activated.

In other embodiments, a method forms a light-emitting diode (LED) structure on a semiconductor substrate. The method includes depositing at least one prep layer on the semiconductor substrate; forming an active multiple quantum well (MQW) region on the at least one prep layer; and depositing a p-layer on the active MQW region; wherein forming the active MQW region includes depositing a first barrier material, depositing an active QW material, and depositing a second barrier material; wherein forming the active MQW region optionally includes depositing a bottom layer between the first barrier material and the active QW material, depositing an interlayer between the bottom layer and the active QW material, and depositing a cap layer between the active QW material and the second barrier material; wherein at least one of depositing the active QW material, depositing the bottom layer, depositing the interlayer, and depositing the cap layer includes incorporating aluminum.

BRIEF DESCRIPTION OF THE DRAWINGS

The appended drawings illustrate only some implementation and are therefore not to be considered limiting of scope.

FIG. 1 illustrates a commonly implemented prior-art microLED structure.

FIG. 13 is a schematic cross-section illustrating one example microLED structure that is similar to the microLED structure of FIG. 12, and further includes an aluminum-containing bottom layer, in embodiments.

DETAILED DESCRIPTION

Figure 2:
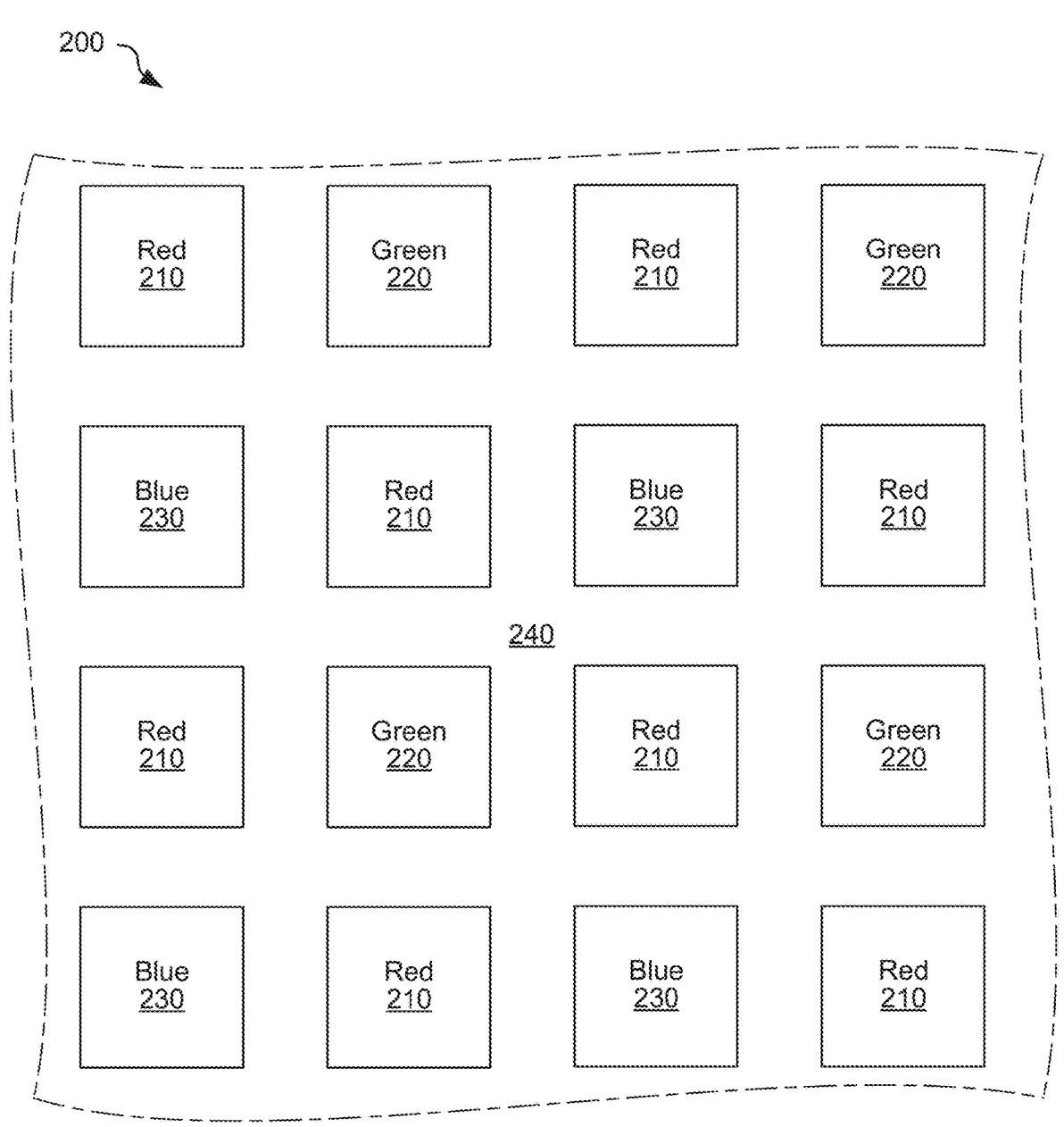
FIG. 2 is a top view illustrating a portion of one example LED array with multiple microLED structures supported by a single substrate for use in a display, in embodiments.

The detailed description set forth below in connection with the appended drawings or figures is intended as a description of various configurations and is not intended to represent the only configurations in which the concepts described herein may be practiced. The detailed description includes specific details for providing a thorough understanding of various concepts. However, it will be apparent to those skilled in the art that these concepts may be practiced without these specific details. In some instances, well known components are shown in block diagram form to avoid obscuring such concepts.

For certain applications, microLED structures operating at red, green, and blue (RGB) wavelengths are combined in low fill-factor, low density displays for low cost, low power consumption applications, such as for smartwatches, smartphones, and televisions. In such low density displays, the microLED structures of each color are fabricated separately, then transferred and combined on a separate display backplane of low fill-factor RGB pixels to provide a full color equivalent of existing liquid crystal displays or organic light emitting diode displays with an advantage of a lower power consumption, for example.

In another application approach, microLED structures (e.g., LEDs with form factors on the order of ten microns or smaller) may be used to form high density arrays of light emitters to enable a new class of display applications, such as compact light field displays for augmented reality (AR) or virtual reality (VR) imaging. One way to achieve such high-density arrays of microLED structures is to monolithically integrate micron-scale emitters on a single substrate. However, due to the differences in structure and material composition of microLED structures intended to emit light in wavelengths of different ranges (such as red, green, and blue), as well as the difficulty in achieving the necessary precision to transfer separately formed microLED structures onto a backplane in a high-density configuration, monolithic integration of microLED structures emitting at different wavelengths is inherently problematic. For example, while blue and green microLED structures operating with high luminance and efficiency are possible using compatible materials, achieving red (or even long-wavelength green, amber, or red-orange) microLED structures with comparable luminance and efficiency has proven to be difficult. For example, while microLED structures in the blue and green visible wavelength ranges have been demonstrated with high efficiency, microLED structures in the red visible wavelength range have been more difficult to produce.

Figure 1:
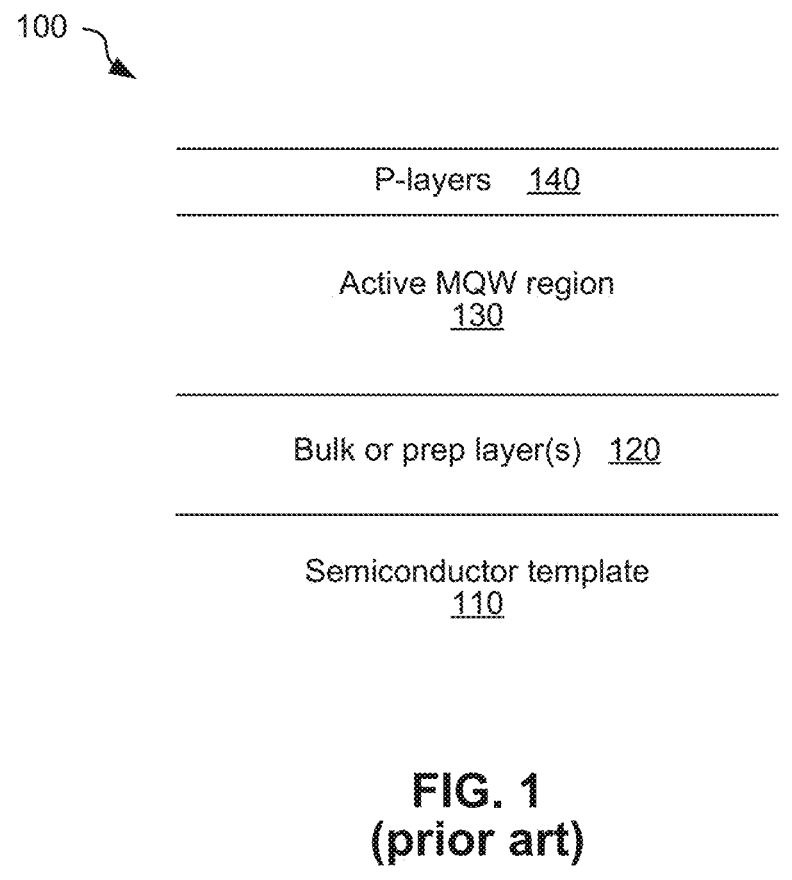

A paper titled "Polar InGaN/GaN quantum wells: Revisiting the impact of carrier localization on the green gap problem," Jan. 28, 2020, Tanner et al. discuss the internal quantum efficiency (IQE) of InGaN-based red LEDs (e.g., at 620 nm and above) as known to be very low (e.g., see Tanner FIG. 1, showing IQE as being essentially zero). The embodiments described herein disclose the inclusion of aluminum within various layers of the LED structure, and have achieved IQE values of 12% and greater at 635 nm wavelengths. Example QW structure layer composition includes one or more of: GaN, AlGaN, GaN, InxGa1-xN, and AlGaN. The improved LED structure may also include one or more additional interlayers that include Aluminum.

One aspect of the present embodiments includes the realization that to meet the needs of display devices, the number and density of light emitting structures that form the display elements (e.g., pixels) should increase and therefore the size of the light emitting structures needs to decrease while maintaining light emission efficiency and quality. The use of small LEDs (e.g., micro-LED structures or nano-emitters) to achieve ever smaller light emitting structures is attractive, but the few techniques for making small LEDs in large numbers, high densities, and capable of producing the different colors (e.g., red, green, blue) are currently cumbersome, time consuming, costly, or result in structures with performance limitations. More sophisticated display architectures, such as for light field displays, may benefit from the use of small LED structures, but the requirements of such displays make the implementation of small LEDs difficult. The present embodiments solve this problem by providing new techniques that allow for monolithic integration of large numbers of small light emitting structures that generate different colors of light on a same substrate (e.g., a single integrated semiconductor device).

The use of certain semiconductor processing techniques for making the light emitting structures, such as epitaxial growth and dry etch or selective area growth (SAG), for example, provide a promising approach for the monolithic integration of a large number of micro LEDs on a single integrated semiconductor device. The quality of the material or materials grown on the template for making the light emitting structures have a significant impact on the performance characteristics of the LEDs To this end, structural configurations that enable the formation of small light emitting structures with high quality active (e.g., emitting) regions are needed. For example, for QW-based LEDs, strategic inclusion of additional layers, which may introduce complexity into the fabrication process, provide functionality to improve or enhance the morphology and/or the directionality of the light emitting structures.

One approach disclosed herein involves incorporating high bandgap materials or layers into the LED structure. In conventional semiconductor devices, high bandgap layers are not typically included unless they are required for device operation or somehow enhance device performance. However, embodiments described herein implement aluminum-containing layers, grown before (e.g., below or underneath) the light-emitting multi-quantum well (MQW) active regions or integrated into the MQW active regions themselves, that improve the quality of the active quantum wells and provide better directionality to the light produced by the active quantum wells. These embodiments provide multiple high brightness microLED structures, with dimensions on the order of ten microns or smaller and that operate over a range of wavelengths across the electromagnetic spectrum, in a monolithic structure that enables a wide range of new applications that were heretofore impossible.

While the discussions below are focused on improvements for microLED structures operating in the red wavelength range, it is noted that the techniques and structures described herein may also be applied to other micro or larger LEDs and other semiconductor-based light emitters operating at other wavelengths, such as in the visible (including long-wavelength green, amber, and red orange), infrared, or ultraviolet wavelengths. A first example of a red wavelength range is between 0.59 μm and 0.76 μm. A second, narrower example of a red wavelength range is between 0.61 μm and 0.76 μm.

FIG. 2 is a top view illustrating a portion of one example LED array 200 with multiple microLED structures 210, 220, and 230 supported by a single substrate 240, where LED array 200 may be used in a display. MicroLED structures 210, 220, and 230 may emit light at red, green, and blue wavelengths, respectively. Although the portion of LED array 200 is shown with sixteen microLED structures, LED array 200 may be a much larger array of microLED structures 210, 220, and 230 that may be used in a display for example, where microLED structures 210, 220, and 230 may be arranged into pixels (e.g., groups or sub-arrays of microLED structures 210, 220, and 230). In such cases, the arrangement of the pixels, their shapes, their numbers, their sizes, and their corresponding wavelength emissions is configurable during manufacture to tailor LED array 200 for specific applications. In certain embodiments, LED array 200 is used in a high resolution, high density display, such as those used in light field applications. In other embodiments, LED array 200 may be incorporated into a compact display for augmented reality (AR) or virtual reality (VR) applications.

In particular, to achieve a high density of emitters, it is desirable to form microLED structures 210, 220, and 230 on substrate 240 in a monolithically integrated manner using mutually compatible processes. That is, rather than forming each type of microLED structure on a separate substrate (e.g., one or more red-emitting microLED structures on a first substrate, one or more green-emitting microLED structures on a second substrate, and one or more blue-emitting microLED structures on a third substrate), then transferring each microLED structure to a fourth substrate to form the microLED array for use in a display, an array of all three types of microLED structures 210, 220, and 230 are directly formed on substrate 240. Particularly, by forming all three types of microLED structures 210, 220, and 230 as an array directly onto substrate 240 (e.g., a single substrate), a higher density LED array may be formed. In other words, rather than forming each color of microLED structures 210, 220, and 230 on separate wafers and transferring each LED to another substrate to form the LED array for the display, LED array 200 achieves a higher density because microLED structures 210, 220, and 230 are formed directly onto substrate 240.

However, it is well documented in existing literature that forming microLED structures using processes and materials compatible with efficient light emission over the necessary wavelength range to produce a full-color display (e.g., a red-green-blue (RGB) display) is extremely difficult. Although highly efficient large-scale (e.g., hundreds of microns in dimensions) nitride-based blue LEDs, such as those based on indium-gallium-nitride (InGaN) QWs, and highly efficient large-scale phosphide-based red LEDs, such as those based on aluminum-gallium-indium-phosphide (Al-GaInP), are readily available, a "Green Gap" resulting from the absence of green LEDs operating at similarly high efficiencies has been recognized for several decades. The traditional approach of forming each type of LED in the respective emission range (e.g., red, blue, green) uses its own optimized process and then transferring the resulting LED structures onto a separate display substrate to form an LED array. This approach has limitations related to the minimum size of the LEDs required to enable the transfer of the independently formed microLED structures to the separate display substrate, as well as the alignment fidelity necessary for precise alignment of the microLED structures to form a high density microLED array. One aspect of the present embodiments includes the realization that forming an array of microLED structures (e.g., red, green, and blue emitting microLED structures) on a single substrate and contributing to a full color image with similar luminance and efficiency levels is very difficult.

The present embodiments solve this problem by using a microLED structure design and fabrication process for controlling the inclusion of active elements within the quantum wells (QWs) to achieve high efficiency microLED structures at longer wavelengths while using materials and manufacturing processes that are compatible with monolithic integration of multiple colors of microLED structures. More specifically, the present embodiments disclose device structures and fabrication processes that enable the formation of high efficiency microLED structures in the longer wavelengths (e.g., red) using materials that are compatible with the manufacture of high efficiency microLED structures in shorter wavelengths (e.g., blue, and green), thus enabling the realization of monolithically integrated arrays of microLED structures emitting at different colors. It is emphasized, however, the techniques disclosed herein are applicable to epitaxially-formed LEDs of all sizes and configurations, including red-only microLED structures, for example.

As mentioned above, highly efficient, large scale nitride-based blue LEDs and phosphide-based red LEDs, separately manufactured, are known. In forming light emitting nitride-based QW structures for longer wavelength LEDs (e.g., red), it is difficult to increase the percentage composition of the necessary active materials, e.g., indium (In) in the QWs to achieve the longer wavelength emission, while maintaining layer uniformity and controlling defects. In particular, especially under high reactant vapor pressure, it is difficult to obtain the desired high percentage of In with good uniformity within the QWs. Reduced indium percentage leads to shorter wavelength emission from the QW structure than the nominal design of the LED. Additionally, defects, such as In clustering, phase separation, and pitting, are commonly seen within the QW structure. There is limited adjustment available via growth condition parameters (e.g., temperature, time, vapor pressure) before improvement in In composition while maintaining suitable material quality reaches a limit for conventional Gallium Nitride (GaN)/InGaN/GaN QW material and growth techniques.

The inclusion of a thin layer of aluminum (Al) as a bottom layer prior to the deposition of the active InGaN QW layer in a MQW structure has been shown to achieve improved blue LED performance due to increased hole concentration in the QW, attributed to additional polarization charge at the Aluminum Gallium Nitride (AlGaN)/InGaN interface, as well as possibly somewhat reduced point defects. Such techniques have been used to produce blue LEDs on silicon substrates, using a stack of a 1 nm layer of AlGaN, a 3.5 nm-thick InGaN QW layer, followed by a 5 nm layer of GaN as the barrier layer ("High-efficiency blue LEDs with thin AlGaN interlayers in InGaN/GaN MQWs grown on Si (111) substrates," S. Kimura, et al, Proc. of SPIE Vol. 9748, 97481U). The inclusion of a material such as Al as a bottom layer appears to aid in carrier distribution within the active region and possible reduction in defects.

However, while the inclusion of Al within an InGaN QW can be feasible for blue LEDs, conventional wisdom would indicate inclusion of Al for red LED would not be suitable. In particular, since Al is a wider bandgap material compared to In, the inclusion of Al within the QW structure would result in a wider overall bandgap for the QW, thus likely resulting in a blue shift (i.e., a shift toward shorter wavelengths) in the emitter wavelength. While this blue shift can easily be compensated for blue LEDs, the usual aim for red LEDs is to achieve light emission with longer wavelengths, such that the inclusion of Al within the QW structure of a red LED would appear to be counterproductive.

Previously, the use of a thin layer (e.g., 1 to 2 nm thick layer) of AlGaN to cap the QW structure has been used in an attempt extend the emission wavelength of nitride-based blue LEDs into the green and even reddish-orange wavelengths. For example, a 1-nm-thick AlGaN layer was deposited as a cap layer directly on top of each 3-nm-thick InGaN QW layer, then topped by a 10-nm-thick InGaN barrier layer in a MQW structure to achieve light emission in the green-yellow, yellow, and amber wavelengths with external quantum efficiency (EQE) values in the 11%-20% range (Hashimoto, "Addressing the green gap with a novel active region," www.compoundsemiconductor.net, March 2014, p. 44). The Hashimoto article speculates that the AlGaN cap layer serves to shift the wave function of the electrons toward the inside of the well, thereby increasing electron-hole overlap and radiative recombination, as well as creating a barrier to electron overflow from each well while recovering the smoothness of the surface after the InGaN well. As yet another example, the same technique, namely the inclusion of a 1 nm-thick AlGaN layer as a cap layer of each QW layer (i.e., a 3-nm-thick active layer of indium-gallium-nitride (InGaN) followed by a 1 nm layer of AlGaN, both grown at 755° C., topped by a 10-nm layer of InGaN grown at 855° C. as a barrier layer) has been shown to produce an LED operating at a wavelength of 629 nm, which is at the shorter edge of the red wavelength range, albeit at a low EQE value of 2.9% (J. I. Hwang, et al, "Development of InGaN-based red LED grown on (0001) polar surface," Applied Physics Express 7, 071003 (2014)). However, an AlGaN cap layer does not appear to prevent defects involving In within the QW structure itself, which is a common cause of the shift of the light emission of red LEDs toward shorter wavelengths as well as low EQE values. In fact, Hwang, et al., specifically note the absence of a red shift in the emission wavelength with increased injection current to drive the resulting LED. Furthermore, in all of the experimental results reported above, each of the LED devices is a large area device, having dimensions on the order of several hundred microns on each side.

As an unexpected result discussed in more detail below, contrary to such conventional wisdom, it has been found that inclusion of Al, either uniformly within or at one or more locations within the MQW structure, indeed results in improved performance of red LEDs, including high-efficiency generation of longer wavelength emission. In particular, the judicious incorporation of aluminum in a bottom layer, a cap layer, even within the active quantum well itself, and combinations thereof have unexpectedly resulted in improved red LED performance with high efficiency and within the red range of the visible spectrum (e.g., longer than 625 nm) even for microLED devices with dimensions as small as one micron on a side.

Figure 3:
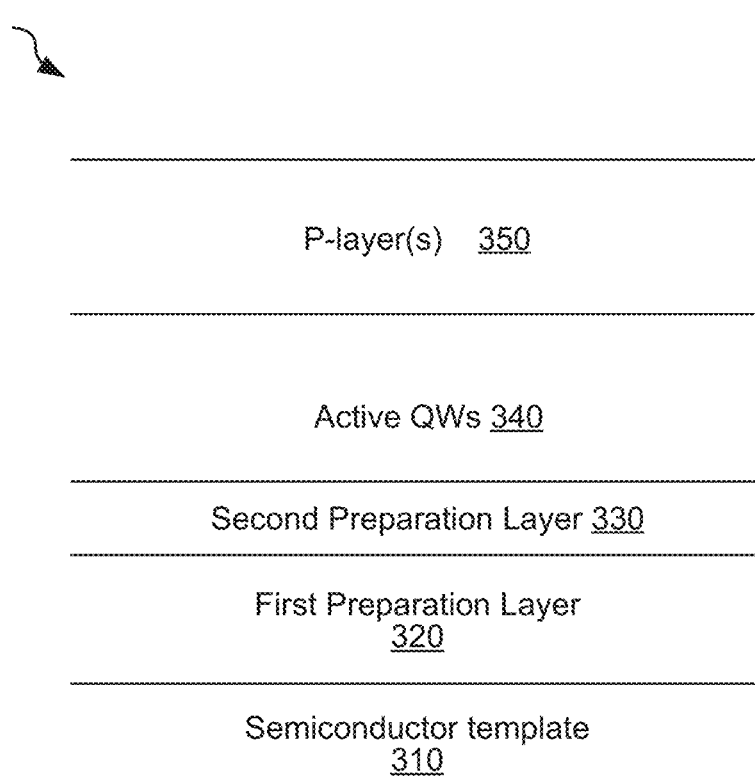
FIG. 3 is a schematic cross-section illustrating one example microLED structure having first and second preparation layers with improved morphology and strain characteristics, in embodiments.

FIG. 3 is a schematic cross-section illustrating one example microLED structure 300 having first and second preparation layers 320 and 330 with improved morphology and strain characteristics. LED structure 300 is formed on a surface of a semiconductor template 310 (e.g., a supporting layer). LED structure 300 includes first preparation layer 320 (preparation layer 1) formed, grown (e.g., epitaxially grown), or deposited over semiconductor template 310, second preparation layer 330 (preparation layer 2) formed, grown, or deposited over first preparation layer 320, an active QW region 340 formed, grown, or deposited over second preparation layer 330, and p-layers 350 that include contact layers (e.g., p-doped layers) formed, grown, or deposited over active QW region 340. In some implementations, a technique such as epitaxial growth and dry etch or selective area growth may be used to define the position, shape, and size of LED structure 300 on semiconductor template 310.

First preparation layer 320 and second preparation layer 330 are configured to prepare the surface used for the formation of active QW region 340 to have the appropriate morphology and strain such that active QW region 340 has improved material characteristics and light emission performance. To this end, first preparation layer 320, second preparation layer 330, or both, includes a high bandgap material, such as an aluminum-containing layer. The aluminum-containing layer, for example, includes an AlInGaN alloy with a composition of Al in the range of 5% to 100%. Each of first second preparation layers 320 and 330 may have a thickness in the range of 0.3 nanometers to 250 nanometers.

Active QW region 340 is configured to emit light during operation of LED structure 300.

In one example, first preparation layer 320 is an aluminum-containing layer and includes a superlattice. The superlattice may be formed by alternating layers of AlInGaN and AlGaN, for example. As an example, the superlattice may be formed by alternating layers of AlInGaN and AlGaN having different Al and In compositions. In another example, first preparation layer 120 is a bulk layer. The bulk layer may be an aluminum-containing layer. Unlike the active QW region 340, first and second preparation layers 320 and 330, respectively, are not configured for emitting light in the same visible wavelengths as the active QW region 340. For example, if active QW region 340 is intended to emit light in the red wavelengths, superlattice included in the first or second preparation layer may be associated with wavelengths in the green, blue, or even ultraviolet wavelengths so as to not interfere with the intended function of active QW region 340.

As an example, second preparation layer 330 may be an aluminum-containing layer as noted above. In one example, second preparation layer 330 may include a superlattice, a bulk layer, one or more QW structures not configured to emit light in the same wavelengths as the active QW region 340 during operation of LED structure 300. Moreover, in those instances in which second preparation layer 330 includes a single quantum well or multiple quantum wells, second preparation layer 330 may additionally include a high bandgap inter layer, such as an AlGaN layer, formed under or over the single quantum well or the multiple quantum wells. The inclusion of first and second preparation layers 320 and 330, respectively, such as incorporating high bandgap materials, such as Al-containing layers, improve the light emitting characteristics of the active QW region 340. For example, by providing advantageous effects such as, but not limited to, increased tolerance to higher temperature processing, trapping migrating impurities, improving strain characteristics, and optimizing the stoichiometry of the active QW region 340, the light emitting performance such as the emission wavelength specification, emission wavelength peak narrowing, and emission intensity of the active QWs can be improved.

Figure 4:
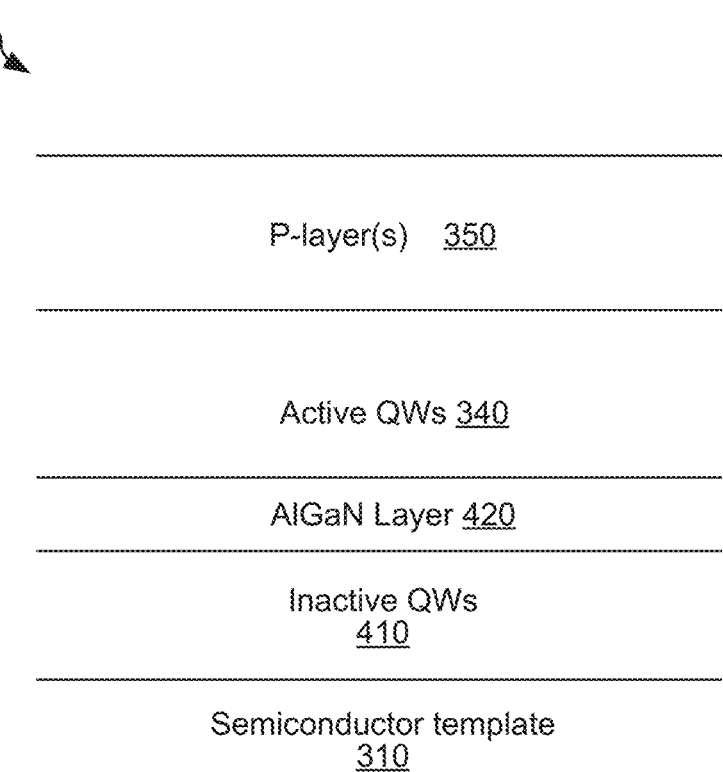
FIG. 4 is a schematic cross-section illustrating one example LED structure having an inactive QW layer and an AlGaN layer, with improved morphology and strain characteristics, in embodiments.

FIG. 4 is a schematic cross-section illustrating one example LED structure 400 with improved morphology and strain characteristics. LED structure 400 is similar to LED structure 300 of FIG. 3, and is formed on a surface of semiconductor template 310, which may be a GaN template or supporting layer. LED structure 400 includes inactive a QW layer 410, an AlGaN layer 420, active QW region 340, and p-layers 350. Although only a single combination of inactive QW 410 layer and AlGaN layer 420 is illustrated, LED structure 400 may include multiple, or repeated, combinations of inactive QW layer 410 and AlGaN layer 420. Inactive QW layer 410 may be associated with a shorter wavelength than an emission wavelength of the active QW region 340. For example, if active QW region 340 is configured for producing light emission in the red wavelengths, inactive QW layer 410 may be associated with wavelengths in the green, blue, or ultraviolet wavelengths. AlGaN layer 420 may be made of different alloys that include AlGaN, such as an AlInGaN alloy with compositions of Al ranging from 5% to 100% relative to In.

In comparison to LED structure 300 of FIG. 3, LED structure 400 includes at least one QW in inactive QW layer 410 with an AlGaN layer 420 formed over the at least one QW. For example, inactive QW layer 410, which may include single or multiple inactive QWs, corresponds to first preparation layer 320, and AlGaN layer 420 corresponds to second preparation layer 330. Although FIG. 4 shows only a single pair of inactive QW layer 410 and AlGaN layer 420, LED structure 400 may include multiple, layered pairs of inactive QW layer 410 and AlGaN layer 420 without departing from the scope hereof.

Figure 5:
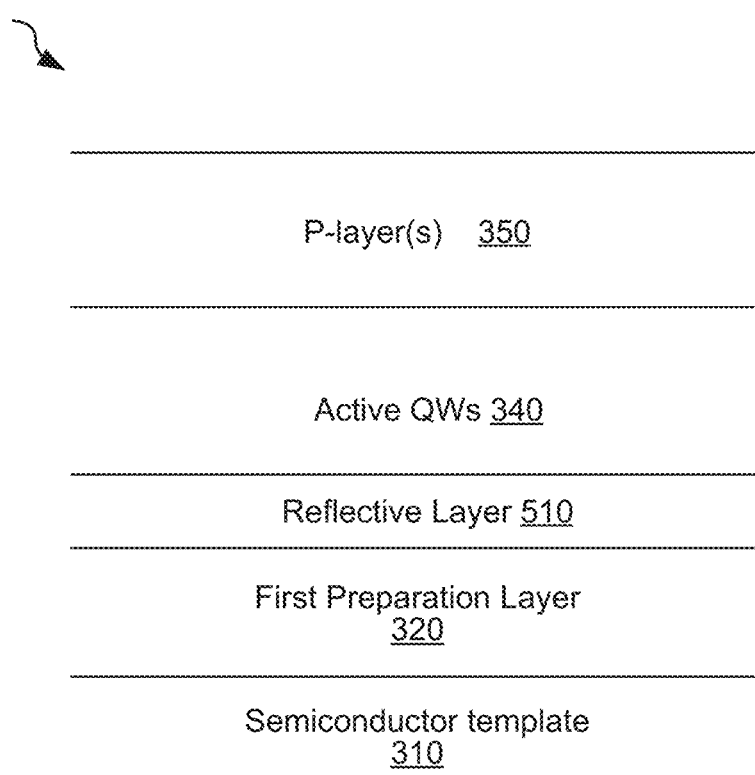
FIG. 5 is a schematic cross-section illustrating one example LED structure with improved directionality, in embodiments.

FIG. 5 is a schematic cross-section illustrating one example LED structure 500 with improved directionality. LED structure 500 is similar to LED structure 300 of FIG. 3, and is formed on a surface of semiconductor template 310. LED structure 500 includes first preparation layer 320, a reflective layer 510, active QW region 340, and p-layers 350. Reflective layer 510 may be an AlInN/GaN bottom mirror or an AlInGaN/InGaN bottom mirror, and may be formed before active QW region 340. In another example, reflective layer 510 may comprise AlInGaN/AlInGaN having different Al and In compositions. Thus, reflective layer 510 may include at least one aluminum-containing layer forming a reflective stack. Where reflective layer 510 is an AlInN/GaN bottom mirror, the AlInN layers have an Al content around 82% with respect to In that may be lattice matched to GaN, thus avoiding strain-related issues in the subsequent active layers while keeping a high refractive index contrast of 7% comparable to AlGaN/GaN system with Al content approximately 50% with respect to In.

Moreover, reflective layer 510 may be, or be configured to serve as, a distributed Bragg reflector (DBR) that allows a radiation pattern produced by active QW region 340 to be tailored for specific applications, thus improving the directionality of the emissions from the active QWs 340. For example, when reflective layer 510 is, or is configured to operate as, a DBR, LED structure 500 may be configured to operate as a resonant cavity LED or a vertical cavity surface-emitting laser (VCSEL). That is, p-layers 350 and reflective layer 510 form a resonator cavity containing active QWs 340, such that LED structure 500 may operate as a resonant cavity LED or VCSEL, depending on the thickness of active QWs 340 relative to the intended emission wavelength of light from active QWs 340.

Each of LED structures 300, 400, and 500, described above, may be fabricated by techniques such as epitaxial growth and dry etch or selective area growth to have a diameter size or feature size of up to one micron, suitable for high density applications. In certain embodiments, the diameter size is greater than one micron, such as between one micron and ten microns.

Using aluminum-containing layers has other benefits in addition to the morphological, strain, and directionality benefits that are provided by LED structures 300, 400, and 500 in connection with the making of small LEDs and the monolithic integration of such small LEDs. These aluminum-containing layers may act as getters to capture impurities and thereby reduce impurities in the active region (e.g., active QW region 340) by localizing them in passive regions of the LED structures. Moreover, the captured or localized impurities may be prevented from moving, even under the application of high temperatures in subsequent process operations. In the example of FIG. 4, AlGaN layer 420, grown on inactive QW layer 410, may be used to getter impurities (e.g., oxygen) that thereby reduces the incorporation of impurities (e.g., oxygen) in active QW region 340. In the example of FIG. 5, AlInN layers, used to form reflective layer 510, may also serve as oxygen gettering layers.

Figure 6:
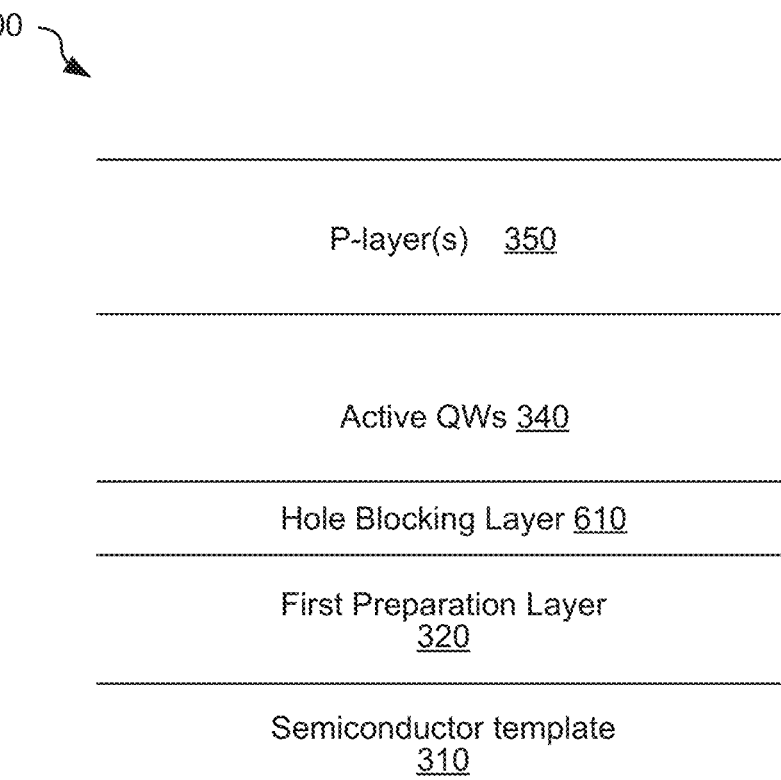
FIG. 6 is a schematic cross-section illustrating one example LED structure with improved performance by reducing hole leakage, in embodiments.

FIG. 6 is a schematic cross-section illustrating one example LED structure 600 with improved performance by reducing hole leakage. LED structure 600 is similar to LED structure 300 of FIG. 3, and is formed on a surface of semiconductor template 310. LED structure 600 includes first preparation layer 320, a hole blocking layer 610, active QW region 340, and p-layers 350. Hole blocking layer 610 prevents hole overflow into active QW region 340 from semiconductor template 310 and first preparation layer 320, as well as hole overflow from active QW region 340 into first preparation layer 320 and semiconductor template 310. In certain embodiments, hole blocking layer 610 may include n-AlGaN. In other embodiments, hole blocking layer 610 is a superlattice formed of AlGaN/GaN or InAlN/GaN layers that improves emission efficiency of active QW region 340. However, hole blocking layer 610 may use other suitable materials, including n-AlGaN, n-doped AlGaN/GaN super-lattice, and n-doped InAlN/GaN superlattice.

Figure 7:
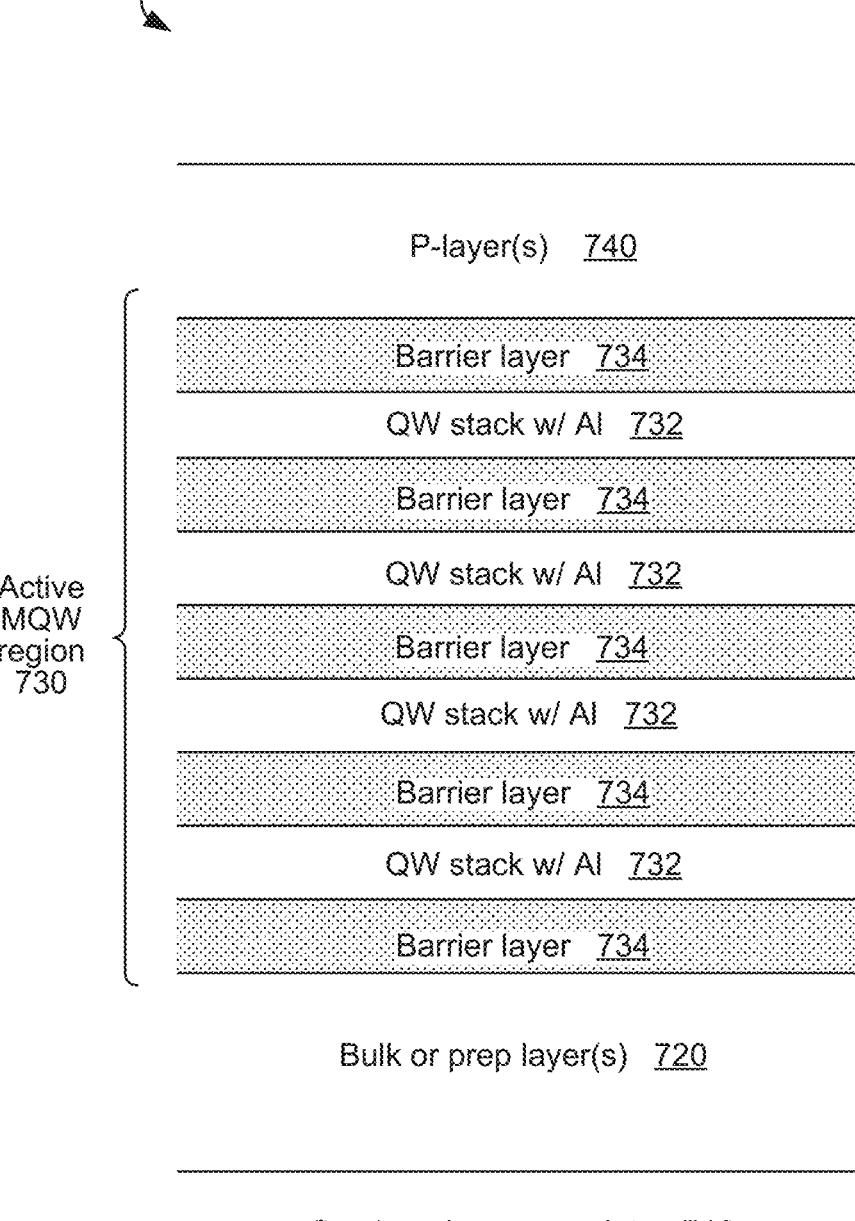
FIG. 7 is a schematic cross-section illustrating one example microLED structure with aluminum included within an active multiple quantum well (MQW) region, in embodiments.

FIG. 7 is a schematic cross-section illustrating one example microLED structure 700 with aluminum introduced into an active MQW region 730. MicroLED structure 700 includes a semiconductor template 710, also known as a semiconductor substrate, for supporting one or more bulk or prep layers 720, active MQW region 730, and at least one p-layer 740. Active MQW region 730 may be formed on bulk or prep layers 720 and includes at least one active QW stack 732, with aluminum inclusions, that has adjacent barrier layers 734 (e.g., GaN or InGaN barrier layers). Each active QW stack 732 may include a single layer of alumi-num-containing material, or may include two or more layers of different materials where at least one of these layers contains aluminum. The example of FIG. 7 shows active MQW region 730 with four active QW stacks 732, each having adjacent barrier layers 734; however, fewer or more active QW stacks 732 and corresponding barrier layers 734 may be included, depending on the desired light emission performance of microLED structure 700.

As mentioned above, the inclusion of Al, which is a wider bandgap material compared to In, would appear to favor shorter wavelength light emission from the resulting microLED structure. However, counterintuitively, the judi-cious inclusion of Al results in microLED structures with higher efficiency and photoluminescence performance as compared to microLED structures without Al inclusion. More specifically, the inclusion of Al shifts the wavelength emitted from the microLED structure toward shorter wave-lengths (e.g., blue shift) with increased current density across the LED structure as discussed above, thus requiring adjustments in the overall microLED structure to compen-sate for the blue shift. Various methods of incorporating Al into active QW stacks 732 are disclosed, such as specific layers in and around the active QW region, described in further detail below.

Figure 8A:
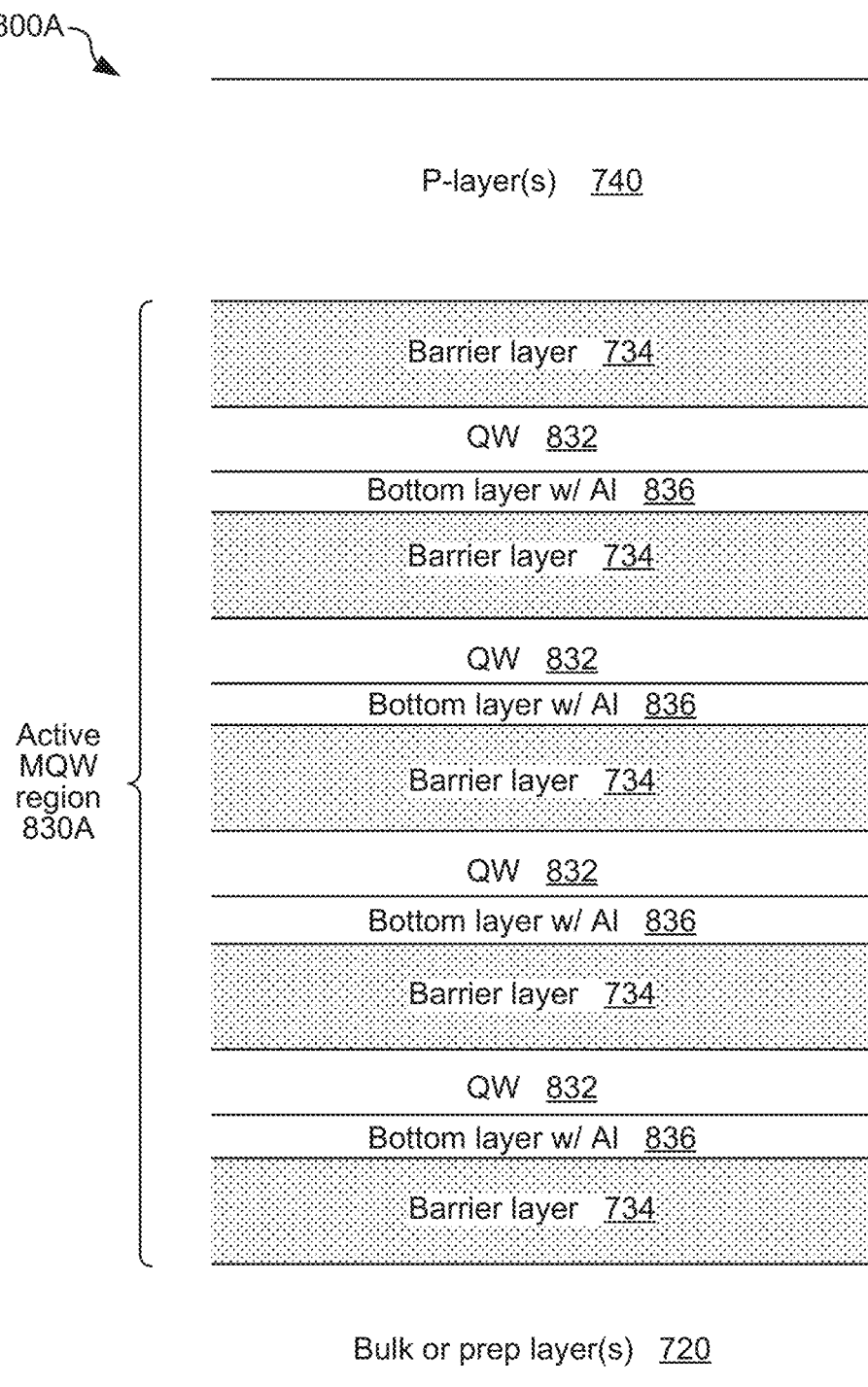
FIGS. 8A and 8B are schematic cross-sections illustrating example microLED structures that include aluminum-containing bottom layers within active MQW regions, in embodiments.
Figure 8B:
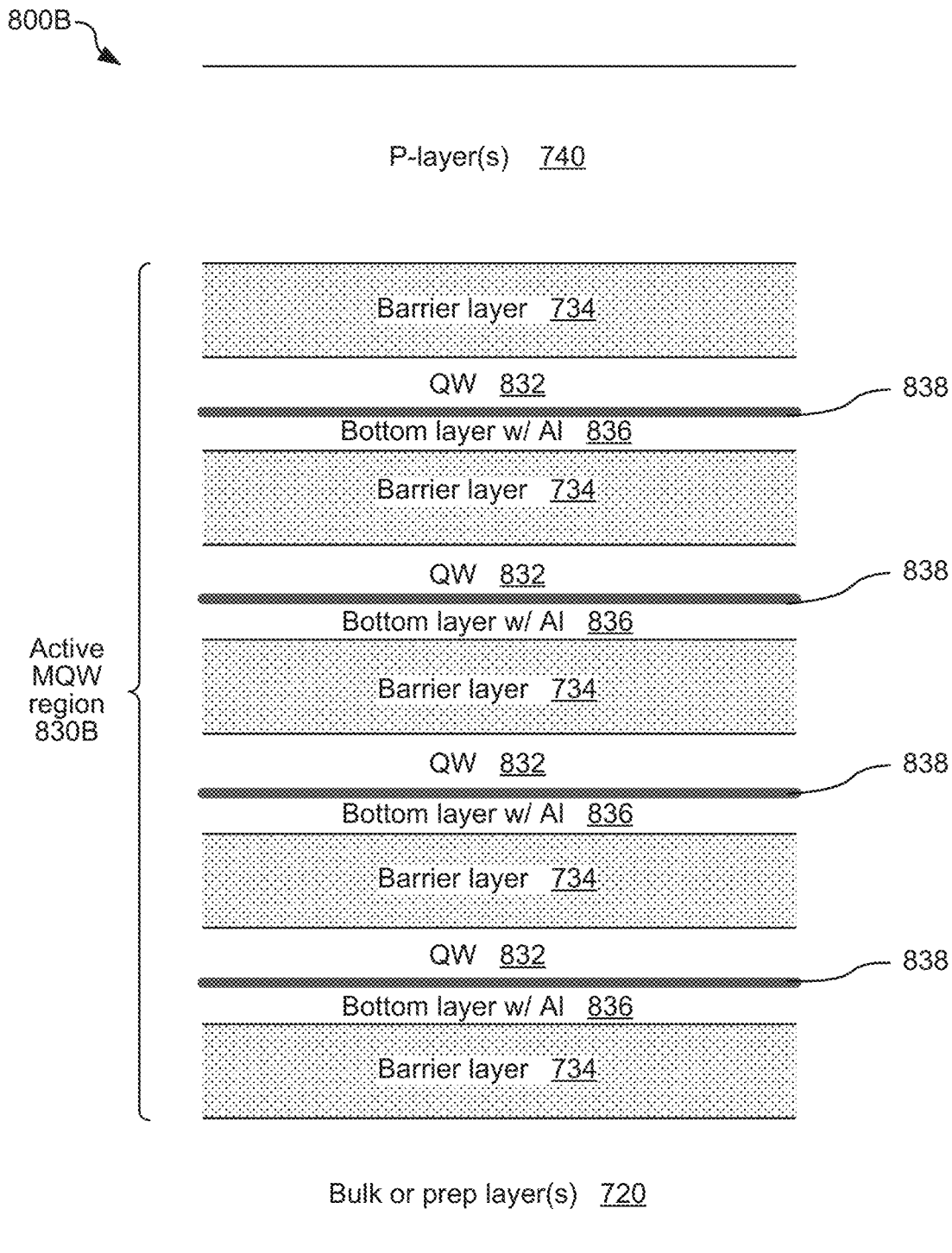

FIGS. 8A and 8B are schematic cross-sections illustrating example microLED structures 800A and 800B, which include aluminum-containing bottom layers within active MQW regions 830A and 830B, respectively. MicroLED structures 800A and 800B are similar to microLED structure 700 of FIG. 7. Active MQW regions 830A and 830B are formed on bulk or prep layers 720. FIG. 8A shows active MQW region 830A of microLED structure 800A including a stack of four active QW layers 832, which are collectively referred to as a QW stack. Each QW layer 832 is deposited on top of a respective AlGa(In)N bottom layer 836 (hereafter Al bottom layer 836) to form pairs of layers that are separated by barrier layer 734. Al bottom layer 836 may range in thickness from a few atomic layers to a few nanometers. Beyond such thicknesses, Al bottom layer 836 may lead to undesirable blue shifts in the microLED struc-ture due to the increased bandgap. Active QW layer 832 may be formed of InGaN. Al bottom layer 836 is an alloy including aluminum, such as one of AlGaN, AlInN, and InAlGaN, that is compatible with the fabrication process of nitride-based microLED structures, such as microLED structure 800A. Al bottom layer 836 may be referred to as an interlayer.

The inclusion of an AlGaN bottom layer below the active QW layer in a QW-based LED structure has been demon-strated in the blue wavelengths, which conceptually makes sense as a blue shift in the emission wavelength resulting from the introduction of Al is compatible with blue LEDs. However, while the additional inclusion of Al bottom layer 836 would appear to further widen the effective bandgap of active MQW region 830A, the Al inclusion within Al bottom layer 836 results in improved high In content material quality and uniformity within active QW layer 832. It appears that the inclusion of an AlGaN or AlInN bottom layer modifies the crystal surface morphology upon which the active QW layer is grown, reducing defects and improv-ing stability of the material during high temperature pro-cessing, such as during the growth of barrier layer 734. Thus, any blue shift resulting from the effectively wider bandgap of active MQW region 830A appears to be overcome by the improved growth mode and reduction in defects within active QW layers 832. Consequently, microLED structure 800A unexpectedly yields superior efficiency and longer wavelength emission as compared to a microLED structure that does not have the combination of features shown in FIG. 8A. For example, microLED structure 800A has been dem-onstrated to exhibit similar peak IQE values with a blue shift of 10 nm or less in wavelength with increased applied current density, in comparison to a prior art LED structure 100 with otherwise similar material structure.

FIG. 8B shows microLED structure 800B that is similar to microLED structure 800A of FIG. 8A, but includes an interlayer 838 between Al bottom layer 836 and active QW layer 832 of an active MQW region 830B. Interlayer 838 may be formed of a traditional barrier layer material such as GaN or other materials such as AlGaN, InGaN and AlInGaN materials of various compositions compatible with nitride-based microLED fabrication. The combination of Al bottom layer 836 and interlayer 838 further improves adhesion and uniformity of active QW layer 832, reduces defects at the interfaces and within active QW layer 832, and increases In retention within each active QW layer 832. Consequently, light emission of microLED structure 800B is shifted toward the red wavelengths, and the quantum efficiency perfor-mance of microLED structure 800B is improved as com-pared to microLED structures that do not include Al bottom layer 836.

Figure 9:
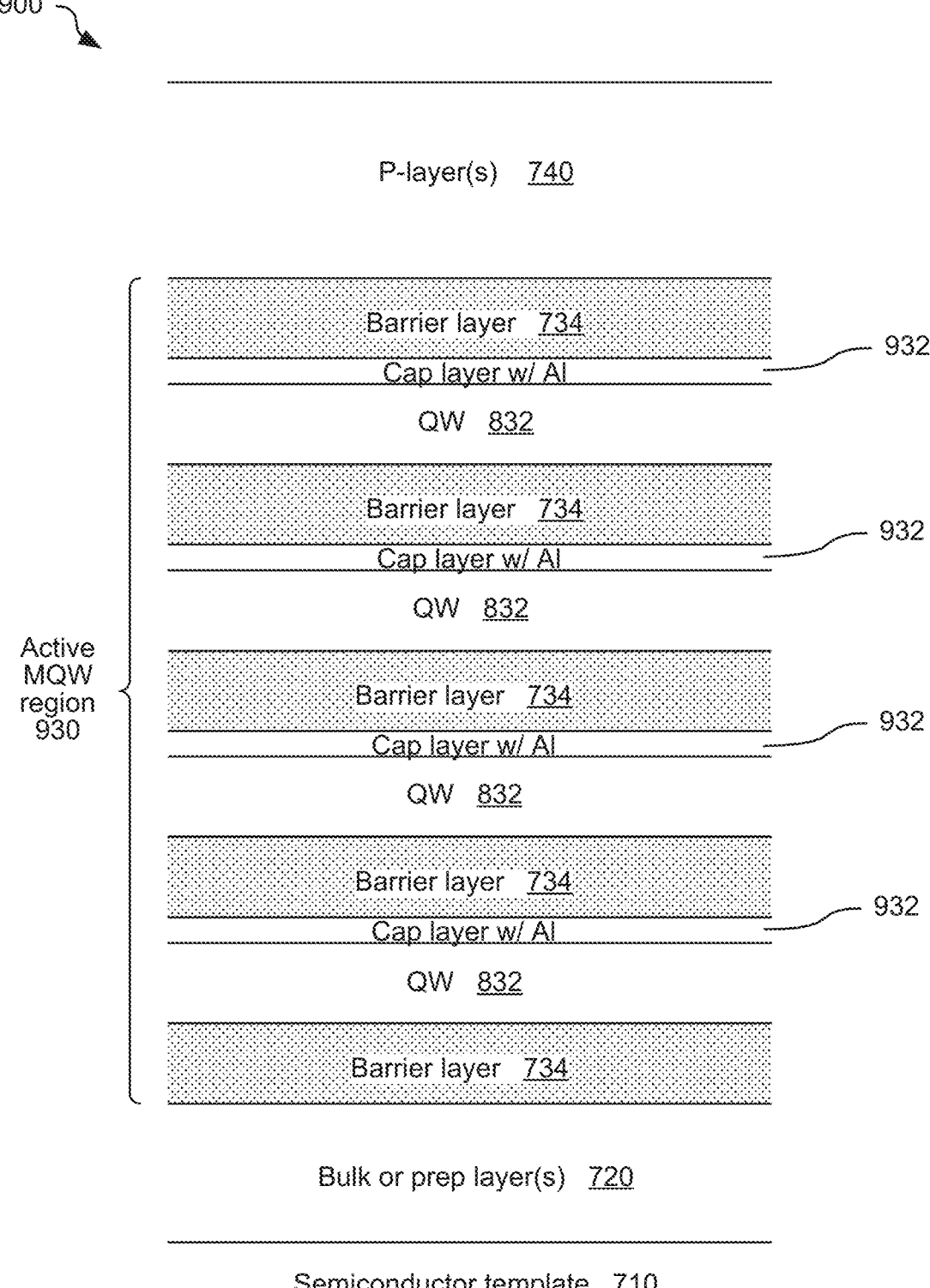
FIG. 9 is a schematic cross-section illustrating one example microLED structure including an aluminum-containing cap layer positioned above an active QW within an active MQW region, in embodiments.

FIG. 9 is a schematic cross-section illustrating one example microLED structure 900 that is similar to microLED structure 700 of FIG. 7, and further includes an aluminum-containing cap layer 932 (referred to as Al cap layer 932 hereinafter) positioned above active QW layer 832 within an active MQW region 930 that is formed on bulk or prep layers 720. For example, an AlGaN layer with a thickness on the order of one nanometer or less maybe used as cap layer 932. Al cap layer 932 may be referred to as another interlayer. Although the inclusion of Al cap layer 932 would seemingly result in a wider effective bandgap for active MQW region 930, Al cap layer 932 provides a number of advantages, such that Al cap layer 932, like Al bottom layers 836 of microLED structures 800A and 800B, acts to balance strain between active QW layer 832 and barrier layer 734, which allows tailoring of morphology before and after growth of active QW layer 832, retaining In within active QW layer 832, and/or providing band alignment conducive to long wavelength emission while minimizing blue shift. Thus, active QW layer 832 exhibits better In retention and uniformity, resulting in superior efficiency and longer wavelength emission as compared to a microLED without the combination of features shown in FIG. 9.

Al cap layer 932 may act as a barrier to migration of point defects, including hydrogen from any electron blocking layer and p-layers that may be incorporated into the overall structure. However, it is recognized herein that Al cap layer 932 may not always help prevent defects within active QW layer 832 itself, thus potentially requiring additional measures, such as the inclusion of Al bottom layer 836 as illustrated in FIGS. 8A and 8B.

Figure 10:
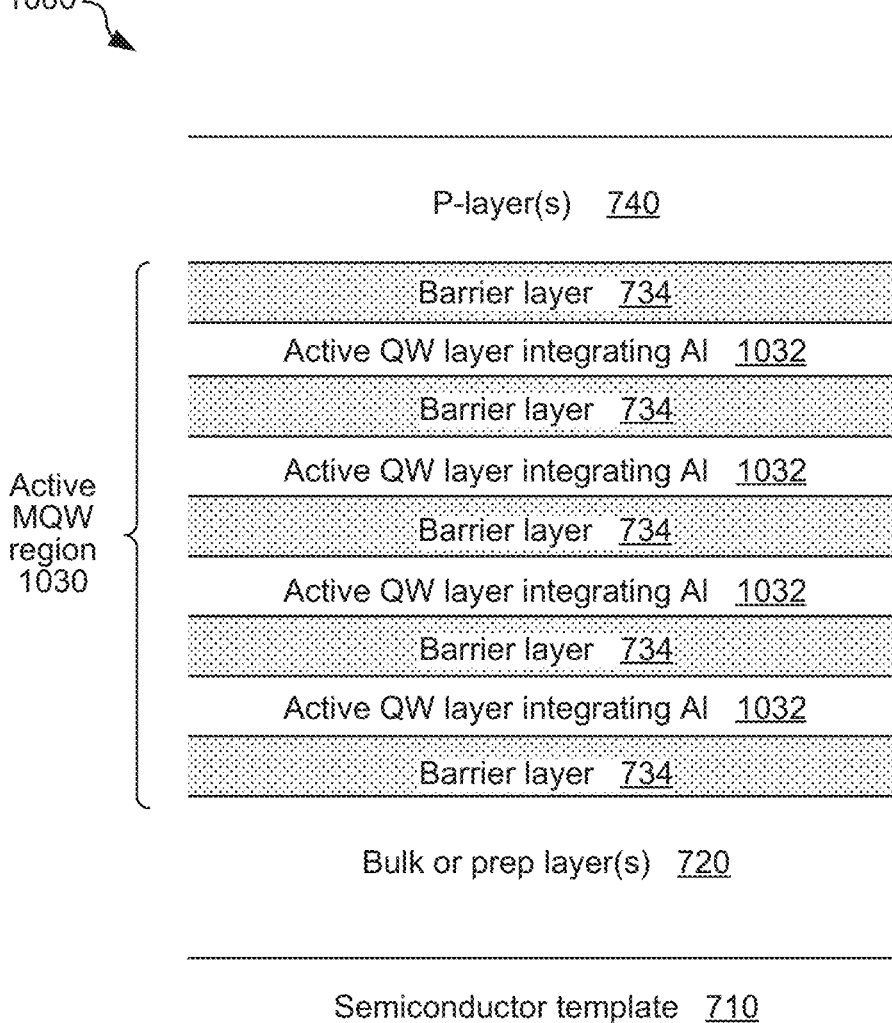
FIG. 10 is a schematic cross-section illustrating one example microLED structure including aluminum incorporated within at least one active QW layer, in embodiments.

FIG. 10 is a schematic cross-section illustrating one example microLED structure 1000 that includes aluminum within at least one active QW layer 1032 of an active MQW region 1030 that is formed on bulk or prep layers 720. Although shown with four active QW layers 1032, also collectively referred to as a QW stack, active MQW region 1030 may include more or fewer active QW layers 1032 without departing from the scope hereof. In certain embodiments, during deposition of active QW layer 1032, an Al-containing gas is introduced at a specific concentration to incorporate Al into the alloy composition of active QW layer 1032 at concentrations of between 0.01 to 5%, for example. In certain embodiments, this process is performed for all active QW layers 1032 within active MQW region 1030 to include Al. In other embodiments, a similar process is used to vary the amount of Al included with each active QW layer 1032 of active MQW region 1030. For example, Al inclusion within a particular QW layer may be in the form of a pseudo alloy, digital alloy, or short period superlattice. Within active MQW region 1030, active QW layers 1032 are separated by barrier layers 734, formed of a suitable material such as GaN.

The inclusion of Al within active QW layer 1032 improves In distribution uniformity and prevents In desorption from active QW layer 1032 during subsequent high temperature processing, such as during the growth of barrier layer 734, which usually requires a temperature approximately 100° C. higher than during the deposition of active QW layer 1032. Inclusion of Al appears to compensate for QW strain, thus modifying the polarization-induced electric field. In other words, the inclusion of Al during deposition of active QW layer 1032 appears to improve In containment and In retention, reduce defects associated with high In content InGaN material, and/or enhance InGaN stability within active QW layer 1032, thus overcoming the potential negative effects of including a wider bandgap material such as Al. Furthermore, Al may be used as a dopant within active MQW region 1030 for a variety of wavelengths for light emitting structures, including both traditional LEDs (with dimensions on the order of a hundred microns or greater) and microLED structures configured for operating at wavelengths in the infrared, visible, and ultraviolet wavelengths. Al is advantageous because Al is a standard precursor readily available in systems commonly used to produce QW structures, such as in metal organic chemical vapor deposition (MOCVD) systems.

Incorporation of Al into active QW layer 1032 varies depending on the growth conditions (e.g., temperature, pressure, time) of the active QW material, and thus the amount of Al inclusion into active QW layer 1032 may be adjusted to provide the desired properties of active QW layer 1032. Although active MQW region 1030 is shown with four active QW layers 1032, more of fewer active QW layers 1032, and corresponding barrier layers 734, may be included to achieve the desired light emission and operative characteristics of microLED structure 1000.

Figure 11:
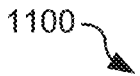
FIG. 11 is a schematic cross-section illustrating one example microLED structure that is similar to the microLED structure of FIG. 10, and further includes an aluminum-containing bottom layer, in embodiments.

FIG. 11 is a schematic cross-section illustrating one example microLED structure 1100 that is similar to microLED structure 1000 of FIG. 10, and further includes an aluminum-containing bottom layer, such as Al bottom layer 836 of microLED structures 800A and 800B of FIGS. 8A and 8B. An active MQW region 1130 is formed on bulk or prep layers 720 and includes a combination of Al bottom layer 836, and active QW layer 1032, both having Al inclusion. Al bottom layer 836 appears to promote deposition uniformity and adhesion of active QW layer 1032 therein, and Al inclusion within active QW layer 1032 promotes In retention within the QW, thus resulting in improved quantum efficiency in the red wavelengths as compared to quantum efficiency in the red wavelengths of a microLED structure that does not include features of FIG. 11. In certain embodiments, interlayer 838 (as shown in FIG. 8B) may be included between Al bottom layer 836 and active QW layer 1032.

Figure 12:
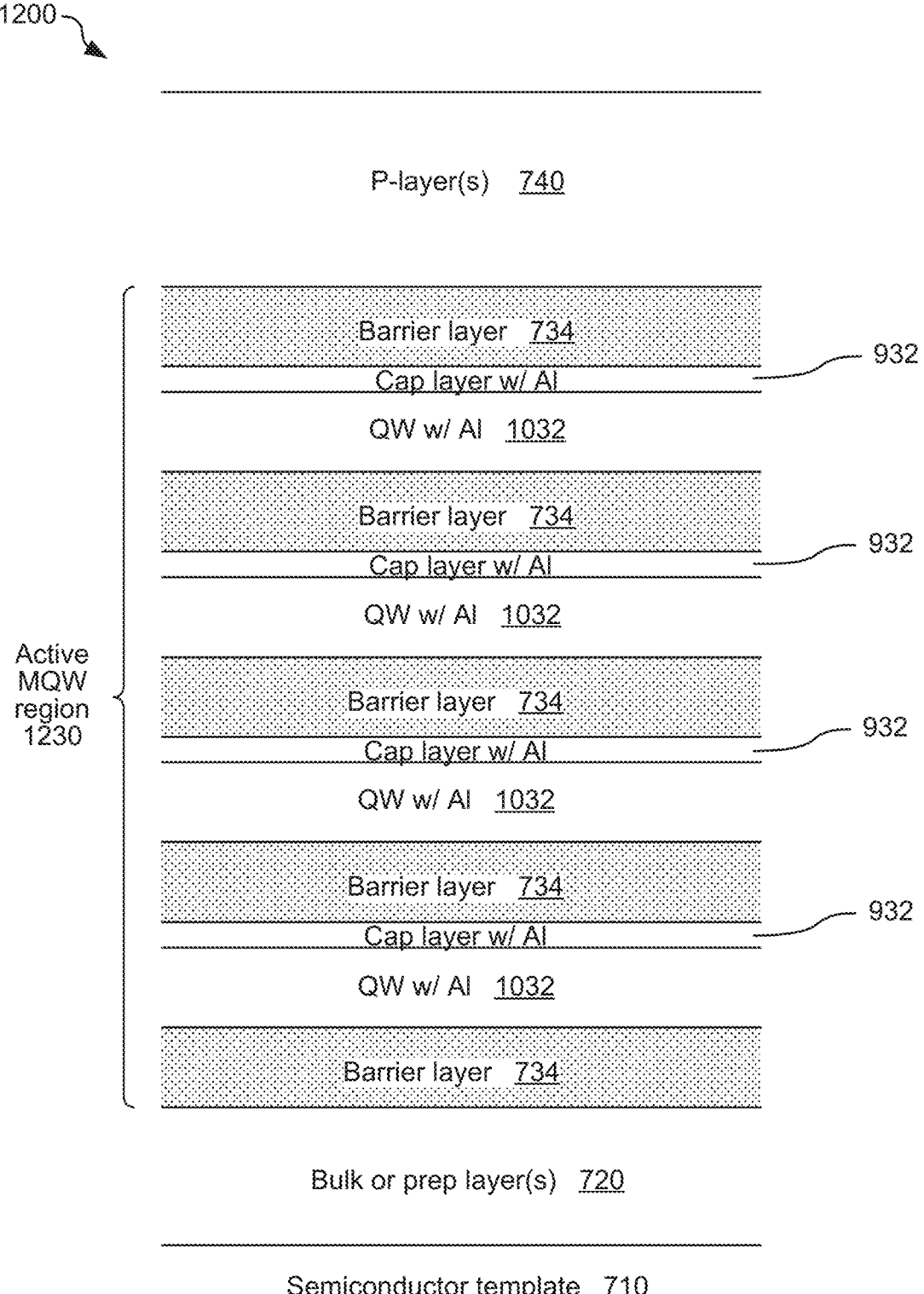
FIG. 12 is a schematic cross-section illustrating one example microLED structure that is similar to the microLED structure of FIG. 10, and further includes an aluminum-containing cap layer, in embodiments.

FIG. 12 is a schematic cross-section illustrating one example microLED structure 1200 that is similar to similar to microLED structure 1000 of FIG. 10, and further includes Al cap layer 932 of microLED structure 900, FIG. 9. An active MQW region 1230 of microLED structure 1200 is formed on bulk or prep layers 720 and includes Al cap layer 932 with active QW layer 1032 that also includes Al. The combination of active QW layer 1032 topped with Al cap layer 932 promotes In retention within active QW layer 1032, thus leading to improved quantum efficiency in the red wavelengths as compared to quantum efficiency in the red wavelengths of a microLED structure without active MQW region 1230.

FIG. 13 is a schematic cross-section illustrating one example microLED structure 1300 that is similar to microLED structure 1200 of FIG. 12, and further includes Al bottom layer 836 of FIG. 8B. MicroLED structure 1300 has an active MQW region 1330, formed on bulk or prep layers 720, that, for each active QW layer 1032, includes Al bottom layer 836, and Al cap layer 932, and further includes barrier layers 734 adjacent Al bottom layer 836 and Al cap layer 932. Optionally, as shown in FIG. 13, where Al bottom layer 836 is AlGa(In)N for example, interlayer 838 may be disposed between Al bottom layer 836 and active QW layer 1032. The inclusion of Al within active MQW region 1330 improves the In distribution uniformity within each active QW layer 1032, promotes In retention within active MQW region 1330, and reduces In desorption from active QW layers 1032 during the growth of barrier layers 734. MicroLED structure 1300 therefore combines the beneficial effects of the microLED structures shown in FIGS. 8B, 9, and 10.

Figure 14:
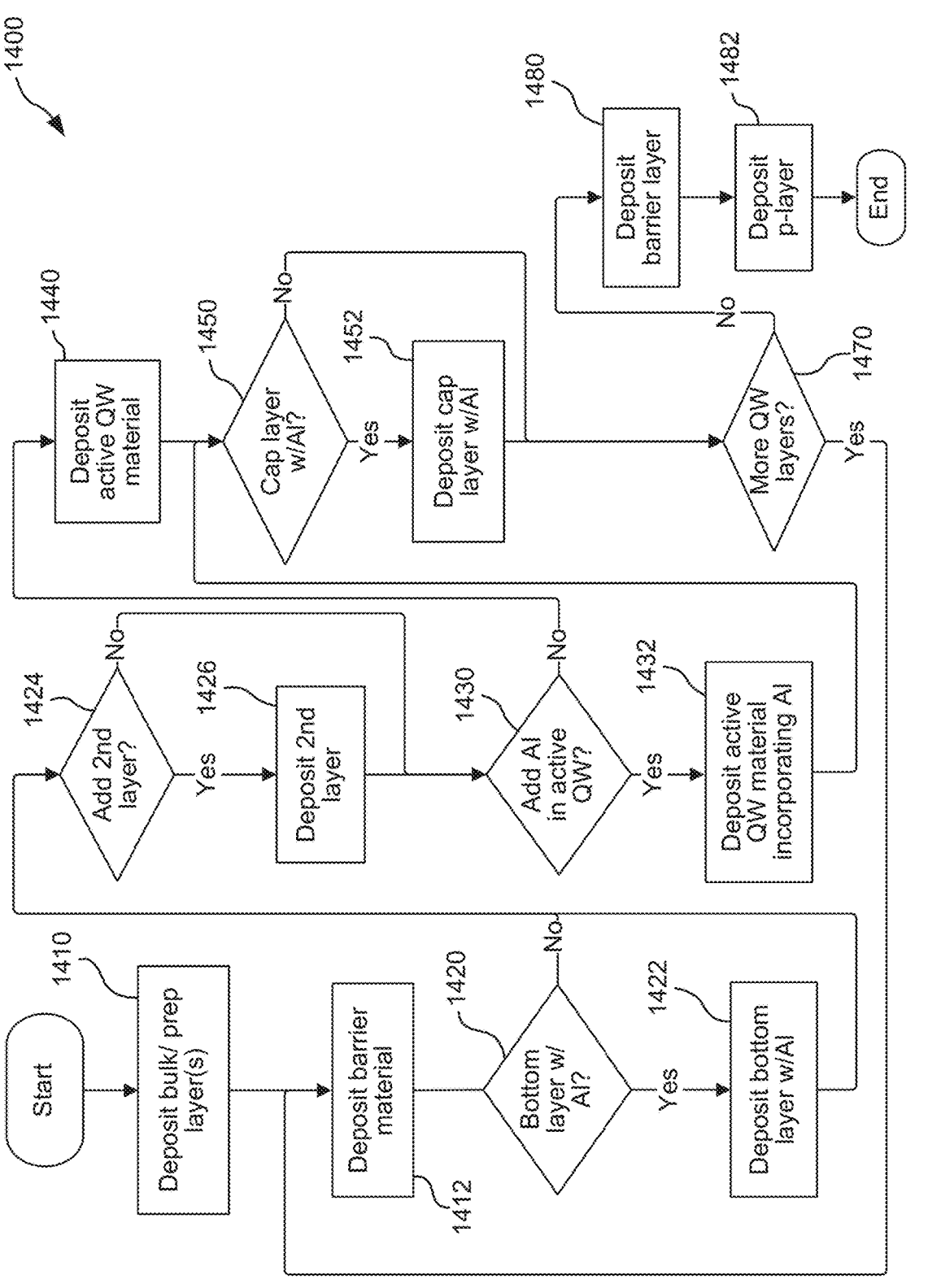
FIG. 14 is a flow chart illustrating one example process for fabricating a microLED structure, in embodiments.

FIG. 14 is a flow chart illustrating one example process 1400 for fabricating a microLED structure. Process 1400 may take place, for example, within a MOCVD system or other systems suitable for microLED fabrication. In block 1410 of process 1400, one or more bulk or prep layers are deposited on a substrate. In one example of block 1410, first and second preparation layers 320, 330 are deposited onto semiconductor template 310. In another example of block 1410, bulk or prep layers 720 are deposited onto semiconductor template 710. Block 1412 is optional. When included, in block 1412, process 1400 deposits one or more barrier materials. In one example of block 1412, barrier layer 734 is deposited onto bulk or prep layers 720. It is noted that, in certain embodiments, rather than separately depositing a barrier material in block 1412, the first barrier material may be incorporated into one or more bulk or prep layers 720 deposited in block 1410.

Block 1420 is a decision. When, at block 1420, the decision is to add a bottom layer with Al, process 1400 continues with block 1422; otherwise, process 1400 continues with block 1424. In block 1422, process 1400 deposits an Al-including bottom layer. In one example of block 1422, Al bottom layer 836 is deposited on the previously deposited layer.

Block 1424 is a decision. When, at block 1424, the decision is to add an interlayer, then process 1400 continues with block 1426; otherwise, process 1400 continues with block 1430. In block 1426, process 1400 deposits an interlayer into the previously deposited layer. In one example of block 1426, interlayer 838 is deposited onto Al bottom layer 836.

Block 1430 is a decision. When, at block 1430, the decision is to include Al in an active QW layer, process 1400 continues with block 1432; otherwise, process 1400 continues with block 1440. In block 1432, process 1400 deposits active QW material incorporating Al. In one example of block 1432, Al is added as active QW layer 1032 is deposited onto barrier layer 734. In another example of block 1432, Al is added as active QW layer 1032 is deposited onto Al bottom layer 836. In another example of block 1432, Al is added as active QW layer 1032 is deposited onto interlayer 838. Process 1400 then continues with block 1450. In block 1440, process 1400 deposits active QW material without adding Al. In one example of block 1440, active QW region 340 is deposited on to second preparation layer 330. In another example of block 1440, active QW layer 832 is deposited onto Al bottom layer 836. In another example of block 1440, active QW layer 832 is deposited onto interlayer 838. In another example of block 1440, active QW layer 832 is deposited onto barrier layer 734.

Block 1450 is a decision. When, at block 1450, a decision is made to include an Al cap layer, process 1400 continues with block 1452; otherwise, process 1400 continues with block 1470. In block 1452, process 1400 deposits an Al cap layer. In one example of block 1452, Al cap layer 932 is deposited on to active QW layer 832. In another example of block 1542, Al cap layer 932 is deposited onto active QW layer 1032.

Block 1470 is a decision. When, at block 1470, it is determined that additional QW layers are to be deposited, process 1400 continues with block 1412; otherwise, process 1400 continues with block 1480. Accordingly, blocks 1412 through 1470 repeat for each additional QW layer to be added.

In block 1480, process 1400 deposits a barrier material. In one example of block 1480, barrier layer 734 is deposited onto active QW stack 732. In another example of block 1480, barrier layer 734 is deposited onto active QW layer 832. In another example of block 1480, barrier layer 734 is deposited onto Al cap layer 932. In block 1482, process 1400 deposits one or more p-layers. In one example of block 1482, one or more p-layers 350 is deposited onto active QW region 340. In another example of block 1482, p-layer 740 is deposited onto barrier layer 734. Process 1400 may then terminate.

The present disclosure describes various embodiments that use techniques and structures to improve performance in the red wavelengths emitted from microLED structures. While the discussions above focused on microLED structures emitting in the red wavelengths, techniques and structures of the described embodiments may also be used for tailoring the performance of LEDs operating in other wavelength ranges, including at shorter visible wavelengths as well as in infrared wavelengths. Further, while the disclosed embodiments primarily show nitride-based microLED structures, similar material and layering structure modifications for bandgap and defect engineering are applicable for other light emitting structures, such as phosphide-based LED structures. Still further, although the disclosed embodiments relate to inclusion of Al, which is a standard precursor readily available in MOCVD systems commonly used to produce QW structures, within MQW regions of microLED structures, inclusion of other materials may be contemplated to further engineer the desired light emission from a microLED structure. Moreover, additional interlayers may be included, such as between active QW layer 832 and Al cap layer 932 in FIG. 9, and/or between active QW layer 1032 and Al cap layer 932 in FIGS. 12 and 13.

An LED structure may include an active region with at least one quantum well, where the active region is configured to provide a light emission associated from the LED structure. An amount of aluminum is incorporated within the at least one quantum well. The active region of the LED structure may further include at least one aluminum-containing layer incorporating a greater amount of aluminum than the amount of aluminum incorporated within the at least one quantum well. The amount of aluminum incorporated within the at least one quantum well is 0.01 to 5% of the at least one quantum well. The LED structure exhibits a modified internal quantum efficiency value, which is higher than an unmodified internal quantum efficiency value exhibited by an unmodified LED structure without the amount of aluminum incorporated within the at least one quantum well. The LED structure operates at a modified peak wavelength, which is longer than an unmodified peak wavelength at which an unmodified LED structure without the amount of aluminum incorporated within the at least one quantum well. A diameter of the LED structure is less than ten microns.

An LED structure includes an active region configured to provide a light emission associated with the LED structure, wherein the active region includes a barrier layer and an active QW layer, the active QW layer being substantially composed of a primary active QW material, and wherein the active QW layer further includes an amount of a secondary material incorporated within the active QW layer, the secondary material exhibiting a wider bandgap than the primary active QW material. The active region may further include at least one interlayer that incorporates a greater amount of the secondary material than the amount of the secondary material incorporated within the active quantum well layer. The at least one interlayer is disposed between the barrier layer and the active quantum well layer. The at least one interlayer may be a bottom layer. The at least one interlayer may be a cap layer. The secondary material is aluminum. The LED structure exhibits a modified internal quantum efficiency value, which is higher than an unmodified internal quantum efficiency value exhibited by an unmodified LED structure without the amount of secondary material distributed throughout the at least one quantum well. The LED structure operates at a modified peak wavelength, which is longer than an unmodified peak wavelength at which an unmodified LED structure without the amount of secondary material distributed throughout the at least one quantum well. A diameter of the LED structure is less than ten microns.

A method forms a light-emitting diode (LED) structure that includes at least one quantum well region, that includes a barrier layer and an active quantum well layer. When forming the at least one quantum well region, a primary active quantum well material is deposited along with an amount of a secondary material that exhibits a wider bandgap than the primary active quantum well material. The amount of the secondary material is 0.01 to 5% of the primary active quantum well material. Depositing the primary active quantum well material along with the amount of secondary material includes forming a pseudo alloy of the primary active material and the secondary material.

Combination of Features

The following embodiments are specifically contemplated, as well as any combinations of such embodiments that are compatible with one another:

(A) A light-emitting diode (LED) structure includes a bulk or prep layer formed on a semiconductor template, an active region formed on the bulk or prep layer, and at least one p-layer formed on the active region. The active region includes: a first barrier layer formed on the bulk or prep layer; at least one aluminum-containing active quantum well (QW) stack formed on the first barrier layer; and a second barrier layer formed on the active QW stack. The active region emits light from the LED structure when the at least one active QW stack is driven by an injection current.

(B) In the LED structure denoted as (A), the active region is configured to emit light at a red wavelength from the LED structure.

(C) In either of the LED structures denoted as (A) and (B), the at least one active QW stack comprising (a) an aluminum-containing bottom layer formed on the first barrier layer and (b) an active QW layer formed on the aluminum-containing bottom layer.

(D) In any of the LED structures denoted as (A)-(C), the aluminum-containing bottom layer comprising an alloy selected from the group consisting of AlGa(In)N, AlGaN, AlInN, and InAlGaN.

(E) In any of the LED structures denoted as (A)-(D), the at least one active QW stack further comprising (c) an aluminum-containing cap layer formed on the active QW layer.

(F) In any of the LED structures denoted as (A)-(E), the aluminum-containing cap layer comprising a 1-nm-thick AlGaN material.

(G) In any of the LED structures denoted as (A)-(F), the at least one active QW stack comprising (a) an aluminum-containing bottom layer formed on the first barrier layer, (b) an interlayer formed on the aluminum-containing bottom layer, and (c) an active QW layer formed on the interlayer.

(H) In any of the LED structures denoted as (A)-(G), the interlayer comprising a material selected from the group consisting of GaN, AlGaN, InGaN, and AlInGaN.

(I) In any of the LED structures denoted as (A)-(H), the at least one active QW stack comprising an aluminum-containing QW layer formed on the first barrier layer.

(J) In any of the LED structures denoted as (A)-(I), the aluminum-containing QW layer comprises one of a pseudo alloy, digital alloy, and a short period superlattice.

(K) In any of the LED structures denoted as (A)-(J), the at least one active QW stack comprising (a) an aluminum-containing bottom layer formed on the first barrier layer, and (b) an aluminum-containing active QW layer formed on the aluminum-containing bottom layer.

(L) In any of the LED structures denoted as (A)-(K), the at least one active QW stack comprising (a) an aluminum-containing active QW layer formed on the first barrier layer, and (b) an aluminum-containing cap layer formed on the active QW layer.

(M) In any of the LED structures denoted as (A)-(L), the at least one active QW stack comprising (a) an aluminum-containing bottom layer formed on the first barrier layer, (b) an aluminum-containing active QW layer formed on the aluminum-containing bottom layer, and (c) an aluminum-containing cap layer formed on the aluminum-containing active QW layer.

(N) In any of the LED structures denoted as (A)-(M), a plurality of microLED structures are monolithically formed onto the substrate template as an array that includes each of a blue microLED structure that emits light at a blue wavelength, a green microLED structure that emits light at a green wavelength, and a red microLED structure that emits light at a red wavelength.

(O) A light-emitting diode (LED) structure comprises a semiconductor template; a first preparation layer formed on the semiconductor template; a second preparation layer formed on the first preparation layer; at least one active quantum well (QW) layer formed over the second preparation layer; and at least one p-layer formed on the active QW layer; wherein the active QW layer emits light from the LED structure when activated.

(P) In the LED structure denoted as (O), the first preparation layer comprises inactive QWs and the second preparation layer comprises an aluminum-containing bottom layer.

(Q) In either of the LED structures denoted as (O) or (P), the second preparation layer comprises a reflective layer.

(R) In any of the LED structures denoted as (O)-(Q), the second preparation layer comprises a hole-blocking layer.

(S) A method forms a light-emitting diode (LED) structure formed on a semiconductor substrate. The method comprises: depositing at least one prep layer on the semiconductor substrate; forming an active multiple quantum well (MQW) region on the at least one prep layer; and depositing a p-layer on the active MQW region. Forming the active MQW region includes: depositing a first barrier material, depositing an active QW material, and depositing a second barrier material. Forming the active MQW region optionally includes: depositing a bottom layer between the first barrier material and the active QW material, depositing an interlayer between the bottom layer and the active QW material, and depositing a cap layer between the active QW material and the second barrier material. At least one of depositing the active QW material, depositing the bottom layer, depositing the interlayer, and depositing the cap layer includes incorporating aluminum.

Accordingly, although the present disclosure has been provided in accordance with the implementations shown, one of ordinary skill in the art will readily recognize that there could be variations to the embodiments and those variations would be within the scope of the present disclosure. Therefore, many modifications may be made by one of ordinary skill in the art without departing from the scope of the appended claims. Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A light-emitting device comprising:
   a semiconductor substrate; and
   a red light-emitting diode (LED) structure, including:
   an active region disposed on the semiconductor substrate, the active region including:
   a first barrier layer;
   a first aluminum gallium nitride (AlGaN) layer formed on the first barrier layer;
   a quantum well (QW) formed on the first AlGaN layer;
   a second AlGaN layer formed on the QW;
   a second barrier layer; and
   a p-doped layer formed on the active region,
   the QW being configured to emit red light during electrical operation of the light-emitting device.

2. The light-emitting device of claim 1, wherein the red light has a wavelength in a range 610-760 nanometer.

3. The light-emitting device of claim 1, wherein the QW includes indium gallium nitride (InGaN).

4. The light-emitting device of claim 1, wherein the QW includes aluminum indium gallium nitride (AlInGaN).

5. The light-emitting device of claim 4, wherein the AlInGaN has an Al composition in a range 0.01% to 5%.

6. The light-emitting device of claim 1, wherein;
   the first barrier layer is a first gallium nitride (GaN) layer; and
   the second barrier layer is a second GaN layer.

7. The light-emitting device of claim 1, further comprising a green LED structure and a blue LED structure are monolithically formed with the red LED structure on the semiconductor substrate.

8. The light-emitting device of claim 1, wherein the active region includes more than four QWs.

9. The light-emitting device of claim 1, further comprising a preparation layer disposed between the semiconductor substrate and the first barrier layer.

10. The light-emitting device of claim 9, wherein the preparation layer includes indium gallium nitride (InGaN) and does not emit visible light during electrical operation of the light-emitting device.

11. The light-emitting device of claim 1, wherein the red LED structure has a lateral dimension between 1 micrometer (μm) and 10 μm.

12. The light-emitting device of claim 1, wherein the first AlGaN layer and the second AlGaN layer have respective Al compositions in a range 5%-100%.

13. The light-emitting device of claim 1, wherein the QW is in direct contact with the first AlGaN layer and the second AlGaN layer.

14. The light-emitting device of claim 1, wherein the QW is separated from the first AlGaN layer by a spacer layer including gallium nitride (GaN).

15. The light-emitting device of claim 1, wherein the active region is a periodic stack, a period of the periodic stack including the first barrier layer, the first AlGaN layer, the QW, the second AlGaN layer, and the second barrier layer.

16. A monolithic light-emitting diode (LED) device comprising:
   a semiconductor substrate; and
   a red LED structure, a green LED structure, and a blue LED structure formed monolithically on the semiconductor substrate, and respectively emitting red light, blue light and green light during electrical operation of the monolithic LED device,
   the red LED structure including:
   an active region disposed on the semiconductor substrate, the active region including:
   a first barrier layer;
   a first aluminum gallium nitride (AlGaN) layer formed on the first barrier layer;
   a quantum well (QW) formed on the first AlGaN layer;
   a second AlGaN layer formed on the QW; and
   a second barrier layer; and
   a p-doped layer disposed on the active region.

17. The monolithic LED device of claim 16, wherein the QW includes aluminum indium gallium nitride (AlInGaN) with an Al composition in a range 0.01% to 5%.

18. The monolithic LED device of claim 16, further comprising a preparation layer disposed between the semiconductor substrate and the first barrier layer, wherein the preparation layer includes indium gallium nitride (InGaN) and does not emit visible light during electrical operation of the monolithic LED device.

19. A method of forming a light-emitting diode (LED) structure comprising:
   growing an active region on a substrate, the active region including:
   a barrier layer;
   a first layer formed on the barrier layer;
   a quantum well (QW) formed on the first layer; and
   a second layer formed on the QW;
   incorporating Al in at least one of:
   the first layer,
   the QW, or
   the second layer; and
   growing a p-doped layer on the active region,
   the QW being configured to emit red light under electrical operation of the LED structure.

20. The method of claim 19, wherein the QW includes aluminum indium gallium nitride (AlInGaN) with an Al composition in a range 0.01% to 5%.

21. The method of claim 19, further comprising forming a preparation layer disposed between the substrate and the barrier layer, wherein the preparation layer includes indium gallium nitride (InGaN) and does not emit visible light during electrical operation of the LED structure.

* * * * *